(12) United States Patent
Inadomi et al.

(10) Patent No.: US 10,679,845 B2
(45) Date of Patent: Jun. 9, 2020

(54) SUBSTRATE PROCESSING APPARATUS HAVING COOLING MEMBER

(71) Applicant: Tokyo Electron Limited, Tokyo (JP)

(72) Inventors: Hiroaki Inadomi, Kumamoto (JP); Satoshi Okamura, Kumamoto (JP); Satoshi Biwa, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/443,306

(22) Filed: Feb. 27, 2017

(65) Prior Publication Data

US 2017/0256398 A1    Sep. 7, 2017

(30) Foreign Application Priority Data

Mar. 3, 2016 (JP) .................. 2016-041347

(51) Int. Cl.
| | |
|---|---|
| *H01L 21/67* | (2006.01) |
| *H01L 21/02* | (2006.01) |
| *B08B 7/00* | (2006.01) |
| *H01L 21/677* | (2006.01) |
| *B08B 3/08* | (2006.01) |
| *H01L 21/687* | (2006.01) |

(52) U.S. Cl.
CPC .......... *H01L 21/02101* (2013.01); *B08B 3/08* (2013.01); *B08B 7/0021* (2013.01); *H01L 21/6704* (2013.01); *H01L 21/67109* (2013.01); *H01L 21/67742* (2013.01); *H01L 21/67748* (2013.01); *H01L 21/68742* (2013.01); *H01L 21/68785* (2013.01); *H01L 21/02054* (2013.01)

(58) Field of Classification Search
CPC .......... H01L 21/02101; H01L 21/6704; H01L 21/67109; H01L 21/67742; H01L 21/67748; H01L 21/68742; H01L 21/68785; H01L 21/02054; H01L 21/67103; H01L 21/67098
See application file for complete search history.

(56) References Cited

U.S. PATENT DOCUMENTS

| | | | | |
|---|---|---|---|---|
| 4,863,547 A | * | 9/1989 | Shidahara | ............... G03F 7/168 156/345.3 |
| 5,569,350 A | * | 10/1996 | Osada | ................. C23C 16/4586 118/500 |
| 5,772,773 A | * | 6/1998 | Wytman | ........... H01L 21/67103 118/729 |

(Continued)

FOREIGN PATENT DOCUMENTS

| JP | 09-289152 A | 11/1997 |
|---|---|---|
| JP | 10-294275 A | 11/1998 |

(Continued)

*Primary Examiner* — Joseph L Perrin
*Assistant Examiner* — Irina Graf
(74) *Attorney, Agent, or Firm* — Abelman, Frayne & Schwab

(57) ABSTRACT

Disclosed is a substrate processing apparatus. The substrate processing apparatus includes a container body, and a holding member that conveys the substrate from an outside of the container body into the container body and holds the substrate inside the container body during the processing. A substrate support pin supporting a wafer and a cooling plate cooling the holding member are provided outside the container body.

9 Claims, 8 Drawing Sheets

(56) References Cited

U.S. PATENT DOCUMENTS

| | | | | |
|---|---|---|---|---|
| 5,885,353 | A | * | 3/1999 | Strodtbeck ............ B25B 11/005 |
| | | | | 118/319 |
| 5,899,653 | A | * | 5/1999 | Brodine ............ H01L 21/67748 |
| | | | | 414/222.04 |
| 2002/0129475 | A1 | * | 9/2002 | Tsai .................... C23C 16/4586 |
| | | | | 29/25.01 |
| 2012/0088203 | A1 | * | 4/2012 | Mizunaga ......... H01L 21/67109 |
| | | | | 432/253 |
| 2014/0145390 | A1 | * | 5/2014 | Mitsuoka ................. B23H 7/02 |
| | | | | 269/287 |

FOREIGN PATENT DOCUMENTS

| | | | | |
|---|---|---|---|---|
| JP | H11233407 | A | * 8/1999 | ............ G05D 23/19 |
| JP | 2011-222696 | A | 11/2011 | |
| JP | 2013-012538 | A | 1/2013 | |
| JP | 2014-082437 | A | 5/2014 | |
| JP | 2014-236145 | A | 12/2014 | |

\* cited by examiner

US 10,679,845 B2

SUBSTRATE PROCESSING APPARATUS HAVING COOLING MEMBER

CROSS-REFERENCE TO RELATED APPLICATIONS

This application is based on and claims priority from Japanese Patent Application No. 2016-041347, filed on Mar. 3, 2016, with the Japan Patent Office, the disclosure of which is incorporated herein in its entirety by reference.

TECHNICAL FIELD

The present disclosure relates to a technology of removing a liquid attached to a surface of a substrate.

BACKGROUND

In a semiconductor device manufacturing process in which a laminated structure of an integrated circuit is formed on a surface of, for example, a semiconductor wafer (hereinafter, referred to as a "wafer") as a substrate, a liquid processing process is provided to process a wafer surface by using a liquid, for example, to remove fine dust or a natural oxide film on a wafer surface by using a cleaning liquid such as, for example, a chemical liquid.

There has been known a supercritical processing method using a fluid in a supercritical or subcritical state (which may also be collectively referred to as a "supercritical fluid") when removing a liquid or the like attached to the surface of the wafer in the liquid processing process.

However, when performing the supercritical processing on the wafer by using the supercritical fluid, in a pre-process, a dry preventing liquid composed of, for example, isopropyl alcohol (IPA) is first filled on the wafer, the wafer on which the dry preventing liquid has been filled is placed on a holding member positioned outside a container body, and the wafer on the holding member is carried into the container body. Then, the supercritical processing is performed on the wafer inside the substrate processing container by using the supercritical fluid.

After the supercritical processing is completed, the holding member is moved outward so as to discharge the wafer on the holding member outward.

Next, a wafer on which a new dry preventing liquid has been filled is placed on the holding member, and the above-described operation is repeated.

As described above, the dry preventing liquid is filled on the wafer to be placed on the holding member. When the supercritical processing is performed on the wafer inside the substrate processing container, the holding member is also heated to a high temperature. It has been found that, when a wafer on which the new liquid has been filled is placed on the holding member in the state where the temperature of the heated holding member is high, the dry preventing liquid filled on the wafer is dried by the heat from the holding member, and thus, an appropriate supercritical (heating) processing may not be performed on the wafer. See, for example, Japanese Laid-Open Publication No. 2013-12538

SUMMARY

The present disclosure relates to a substrate processing apparatus including: a container body in which a processing is performed on a substrate; a holding member that conveys the substrate from the outside of the container body into the container body and holds the substrate inside the container body during the processing; a substrate support pin that is positioned outside the container body and supports a cooling member configured to cool the holding member and the substrate; and a lift mechanism that moves up and down the cooling member and the substrate support pin with respect to the holding member.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
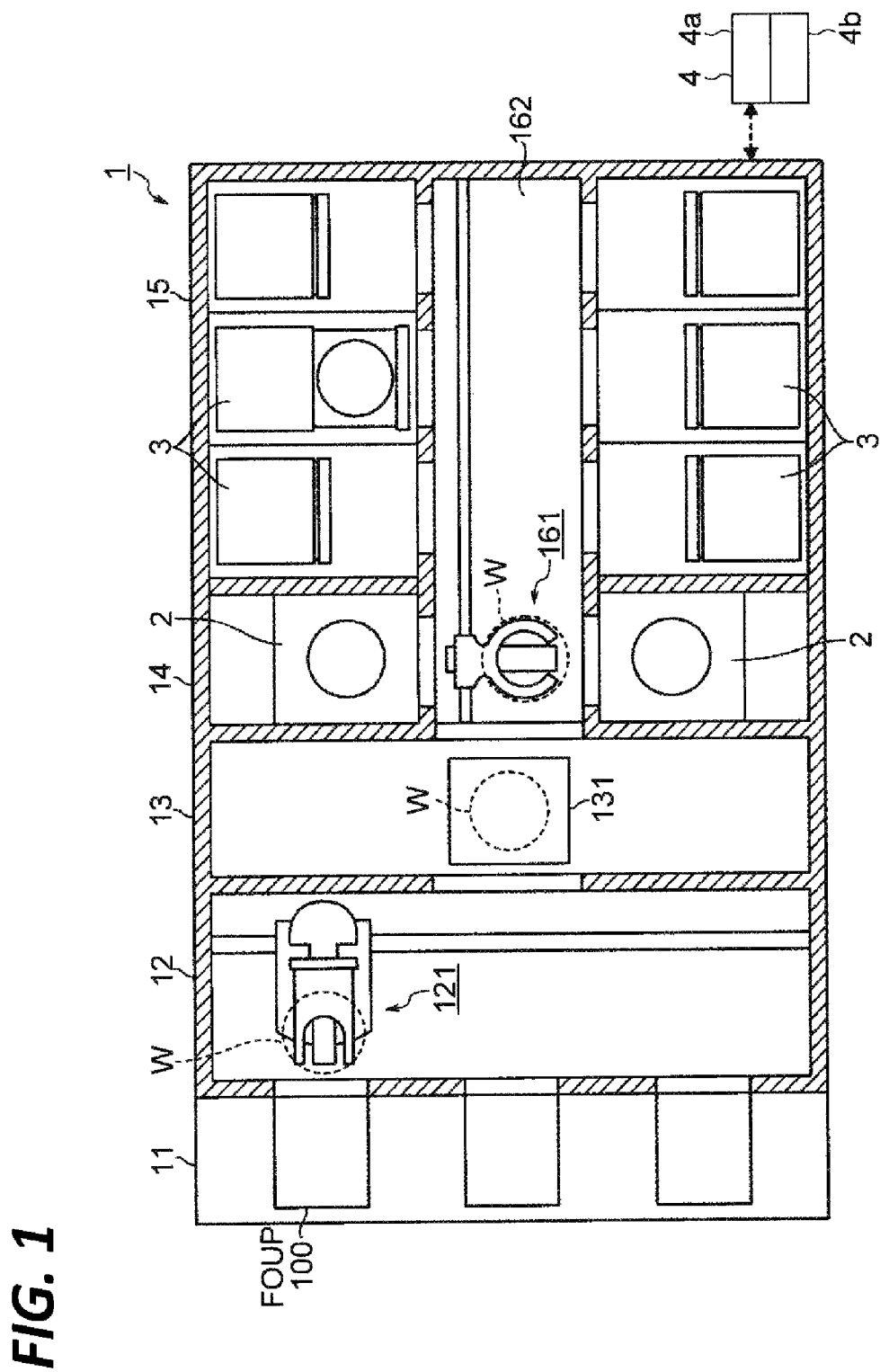
FIG. 1 is a horizontal sectional plan view of a cleaning processing system.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure has been made in consideration of the foregoing, and an object of the present disclosure is to provide a substrate processing apparatus in which an appropriate heating processing may be performed on a substrate on which a liquid is filled, a substrate processing method, and a storage medium storing the method.

The present disclosure provides a substrate processing apparatus including: a container body in which a processing is performed on a substrate; a holding member that conveys the substrate from the outside of the container body into the container body and holds the substrate inside the container body during the processing; a substrate support pin that is positioned outside the container body and supports a cooling member configured to cool the holding member and the substrate; and a lift mechanism that moves up and down the cooling member and the substrate support pin with respect to the holding member.

In the above-described substrate processing apparatus, the cooling member cools the holding member by being in direct contact with the holding member.

In the above-described substrate processing apparatus, the lift mechanism includes a cooling member support pin that moves up the cooling member through a spring.

In the above-described substrate processing apparatus, the lift mechanism includes the substrate support pin that extends to penetrate the cooling member and supports the substrate.

In the above-described substrate processing apparatus, the cooling member has an elastic material on a surface thereof.

In the above-described substrate processing apparatus, the lift mechanism includes a first lift mechanism that moves up and down the cooling member and a second lift mechanism that moves up and down the substrate support pin, and the first and second lift mechanisms independently perform an up-and-down movement operation.

In the above-described substrate processing apparatus, the substrate processing container is a substrate processing container for a supercritical processing.

The present disclosure provides a substrate processing method including: providing a substrate processing apparatus that includes: a container body in which a processing is performed on a substrate; a holding member that conveys the substrate from the outside of the container body into the container body and holds the substrate inside the container body during the processing; a substrate support pin that is positioned outside the container body and supports a cooling member configured to cool the holding member and the substrate; and a lift mechanism that moves up and down the cooling member and the substrate support pin with respect to the holding member; conveying the substrate from the outside of the container body into the container body by the holding member; performing a processing while holding the substrate inside the substrate processing container by the holding member; cooling the holding member by discharging the substrate on the holding member outward, operating the lift mechanism to move up the substrate by the substrate support pin, and simultaneously, causing the cooling member to approach the holding member; and placing a new substrate on the holding member.

The present disclosure provides a non-transitory computer-readable storage medium storing a computer executable program that, when executed, causes a computer to control a substrate processing method including: preparing a substrate processing apparatus which includes: a container body in which a processing is performed on a substrate; a holding member that conveys the substrate from the outside of the container body into the container body and holds the substrate inside the container body during the processing; a substrate support pin that is positioned outside the container body and supports a cooling member configured to cool the holding member and the substrate; and a lift mechanism that moves up and down the cooling member and the substrate support pin with respect to the holding member; conveying the substrate from the outside of the container body into the container body by the holding member; performing a processing while holding the substrate inside the substrate processing container by the holding member; cooling the holding member by discharging the substrate on the holding member outward, operating the lift mechanism to move up the substrate by the substrate support pin, and simultaneously, causing the cooling member to approach the holding member; and placing a new substrate on the holding member.

According to the present disclosure, an appropriate heating processing may be performed on a substrate on which a liquid is filled.

Hereinafter, descriptions will be made on the entire configurations of a substrate processing container, a supercritical processing apparatus 3 (a substrate processing apparatus) including the substrate processing container, and a cleaning processing system 1 according to an exemplary embodiment.

First, descriptions will be made on the cleaning processing system 1 including a cleaning apparatus 2 which performs a cleaning processing by supplying a cleaning liquid to a wafer W as a substrate to be processed, and the supercritical processing apparatus 3 which removes a dry preventing liquid (IPA) attached to the wafer W after the cleaning processing by bringing the dry preventing liquid into contact with supercritical $CO_2$, as an example of a substrate processing system including the substrate processing apparatus of the exemplary embodiment.

FIG. 1 is a horizontal sectional plan view illustrating an entire configuration of the cleaning processing system 1, and the lower side of FIG. 1 is the front side. In the cleaning processing system 1, FOUPs 100 are arranged in a placement section 11, and a plurality of wafers W each having a diameter of, for example, 300 mm are stored in each of the FOUPs 100 and delivered between a cleaning processing section 14 and a supercritical processing section 15 at the rear end of the cleaning processing system 1 through a carry-in/out section 12 and a delivery section 13. The wafers W are sequentially carried into the cleaning apparatus 2 and the supercritical processing apparatus 3 such that the cleaning processing and the processing of removing a dry preventing liquid are performed. In FIG. 1, reference numeral 121 indicates a first conveyance mechanism that transfers the wafers W between the FOUP 100 and the delivery section 13, and reference numeral 131 indicates a delivery shelf serving as a buffer which temporarily places thereon the wafers W to be conveyed between the carry-in/out section 12 and the cleaning processing section 14 or the supercritical processing section 15.

The cleaning processing section 14 and the supercritical processing section 15 are provided in this order from the front side along a wafer conveyance path 162 extending in the front and rear direction from an opening provided between the cleaning processing section 14 and the delivery section 13. In the cleaning processing section 14, two cleaning apparatuses 2 are disposed such that the wafer conveyance path 162 is interposed therebetween. Meanwhile, in the supercritical processing section 15, three supercritical processing apparatuses 3, each of which is the substrate processing apparatus of the present exemplary embodiment, are arranged at each of the opposite sides of the wafer conveyance path 162 such that total six supercritical processing apparatuses are provided.

Wafers W are transferred among the cleaning apparatuses 2, the supercritical processing apparatuses 3, and the delivery section 13 by the second conveyance mechanism 161 disposed in the wafer conveyance path 162. Here, the number of the cleaning apparatuses 2 or the supercritical processing apparatuses 3 arranged in the cleaning processing section 14 or the supercritical processing section 15 is appropriately selected according to, for example, the number of wafers W processed per unit time or a difference of processing time in the cleaning apparatuses 2 and the supercritical processing apparatuses 3. An optimum layout is selected according to, for example, the number of the cleaning apparatuses 2 or the supercritical processing apparatuses 3 to be arranged.

Figure 2:
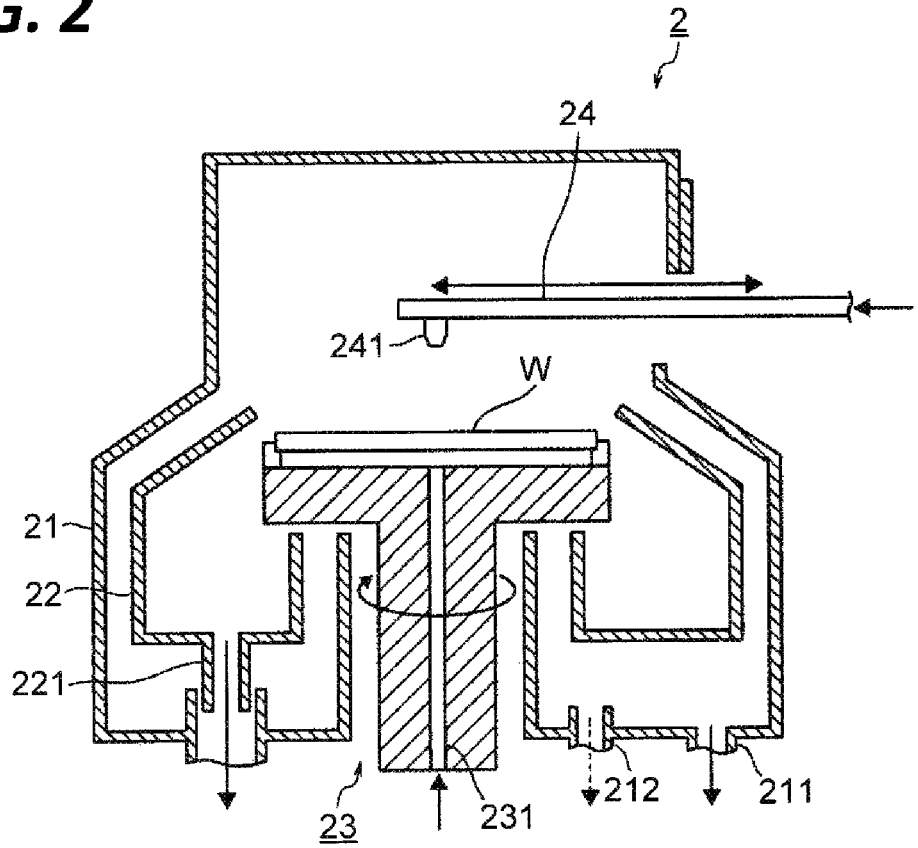
FIG. 2 is a vertical sectional side view of a cleaning apparatus provided in the cleaning processing system.

Each cleaning apparatus 2 is configured as a single wafer cleaning apparatus 2 which cleans the wafers W one by one by, for example, a spin cleaning. As illustrated in the vertical sectional side view of FIG. 2, each wafer W is substantially horizontally held by a wafer holding mechanism 23 disposed inside an outer chamber 21 forming a processing space, and rotated by a rotation of the wafer holding mechanism 23 around a vertical axis. Then, a nozzle arm 24 enters a place above the wafer W which is being rotated, and a chemical liquid and a rinse liquid are supplied in a predetermined order from a chemical liquid nozzle 241 provided at the tip end of the nozzle arm 24 so that the cleaning processing is performed on the front surface of the wafer. In addition, a chemical liquid supply path 231 is also formed inside the wafer holding mechanism 23, and the rear surface of the wafer W is cleaned by a chemical liquid and a rinse liquid supplied from the chemical liquid supply path 231.

For example, the cleaning processing is performed as follows: removal of particles or organic contaminants by an SC1 liquid (a mixture of ammonia and hydrogen peroxide water) as an alkaline chemical liquid→rinse cleaning with deionized water (DIW) as a rinse liquid→removal of a natural oxide film by a dilute hydrofluoric acid aqueous solution (hereinafter, referred to as "DHF") as an acidic chemical liquid→rinse cleaning with DIW. These chemical liquids are received by an inner cup 22 disposed in the outer chamber 21 or the outer chamber 21 to be discharged from drain ports 221 and 211. In addition, the atmosphere inside the outer chamber 21 is exhausted from an exhaust port 212.

When the cleaning processing with the chemical liquids is completed, the rotation of the wafer holding mechanism 23 is stopped, and then, IPA is supplied to the front and rear surfaces of the wafer W to replace the DIW remaining on the surfaces with the IPA. The wafer W that has been subject to the cleaning processing in this way is delivered to the second conveyance mechanism 161 by a delivery mechanism (not illustrated) provided in the wafer holding mechanism 23 in the state where the IPA is filled on the front surface of the wafer W (in the state where a liquid film of the IPA is formed on the front surface of the wafer W), and carried out of the cleaning apparatus 2.

The IPA filled on the front surface of the wafer W in the cleaning apparatus 2 serves as a dry preventing liquid for preventing the occurrence of a pattern collapse caused from the evaporation (vaporization) of the IPA during the transfer of the wafer W from the cleaning apparatus 2 to the supercritical processing apparatus 3 or during the carry-in operation of the wafer W into the supercritical processing apparatus 3.

The wafer W which has been subject to the cleaning processing in the cleaning apparatus 2 and on which the dry processing IPA has been filled is conveyed to the supercritical processing apparatus 3, and a processing of drying the wafer W is performed by bringing the IPA on the surface of the wafer W into contact with supercritical $CO_2$ in the substrate processing container 31 so as to dissolve the IPA in supercritical $CO_2$ thereby removing the IPA. Hereinafter, a configuration of the supercritical processing apparatus (the substrate processing apparatus) according to the present exemplary embodiment will be described with reference to FIGS. 3 and 4.

The supercritical processing apparatus 3 according to the present exemplary embodiment includes the substrate processing container 31 according to the present exemplary embodiment in which the processing of removing the IPA as a dry preventing liquid attached to the front surface of the wafer W is performed, and a fluid supply source 37 that supplies supercritical $CO_2$ as a high-pressure fluid to the substrate processing container 31.

Figure 4:
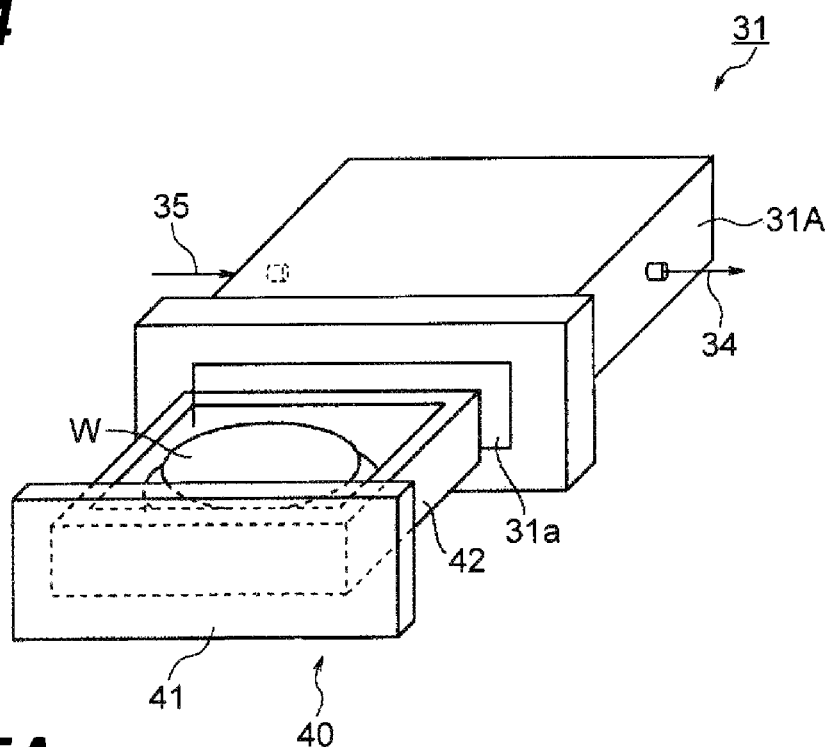
FIG. 4 is a perspective view illustrating an external appearance of a substrate processing container according to an exemplary embodiment of the present disclosure.

As illustrated in FIG. 4, the substrate processing container 31 includes a housing-shaped container body 31A which has an opening 31a for carry-in/out of the wafer W on the lateral side thereof, and a lid device 40 that seals the opening 31. The lid device 40 includes a lid member 41 that seals the opening 31a when the wafer W is carried into the container body 31A, and a holding plate (a holding member) that is connected to the lid member 41 and horizontally holds the wafer W as an object to be processed.

The container body 31A is a container in which a processing space capable of accommodating the wafer W having a diameter of, for example, 300 mm is formed. A fluid supply line 35 (a fluid supply path) configured to supply a high-pressure fluid into the substrate processing container 31 and a discharge line 34 (a discharge path) configured to discharge a fluid in the substrate processing container 31 are connected to the wall portions of the container body 31A. In addition, the substrate processing container 31 is provided with a pressing mechanism (not illustrated) that presses the lid member 41 toward the container body 31A against the internal pressure received from the high-pressure fluid in the high pressure state supplied into the processing space so as to seal the processing space.

The fluid supply line 35 connected to the substrate processing container 31 is connected to the fluid supply source 37 via an opening/closing valve 35a that is opened/closed according to the supply of the high-pressure fluid into the substrate processing container 31 and a stop of the supply, a filter 35b, and a flow rate adjusting valve 35c. The fluid supply source 37 includes, for example, a $CO_2$ cylinder that stores liquid $CO_2$, and a pressure boosting pump (e.g., a syringe pump or a diaphragm pump) that boosts the pressure of the liquid $CO_2$ supplied from the $CO_2$ cylinder to place the liquid $CO_2$ in a supercritical state. For example, FIG. 3 illustrates the $CO_2$ cylinder or the pressure boosting pump substantially in a cylinder shape.

Supercritical $CO_2$ supplied from the fluid supply source 37 is subjected to a flow rate adjustment via the flow rate adjusting valve 35c to be supplied into the substrate processing container 31. The flow rate adjusting valve 35c is configured by, for example, a needle valve, and also used as a blocking unit that blocks the supply of the supercritical $CO_2$ from the fluid supply source 37.

In addition, a decompression valve 34a of the discharge line 34 is connected to a pressure controller 34b, and the pressure controller 34b has a feedback control function to control an opening degree of the decompression valve 34a based on a result of a comparison between a measurement result of the pressure inside the substrate processing container 31 which is acquired from a pressure gauge 38 provided in the substrate processing container 31, and a preset pressure.

Figure 3:
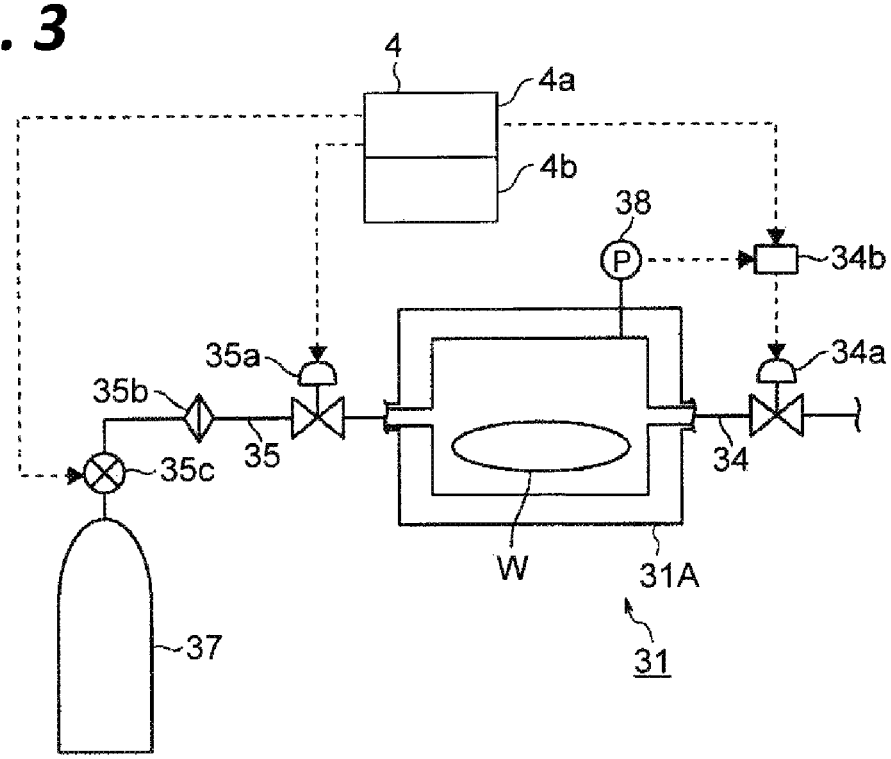
FIG. 3 is a view illustrating a configuration of a supercritical processing apparatus according to the present disclosure.

The cleaning processing system 1, the cleaning apparatus 2, and the supercritical processing apparatus 3 which have the above-described configurations are connected to a controller 4 as illustrated in FIGS. 1 and 3. The controller 4 is configured by a computer 4a including a CPU and a storage unit. The storage unit stores a program programmed with a step (command) group for controls related to the operations of the cleaning processing system 1, the cleaning apparatus 2, and the supercritical processing apparatus 3, i.e., the operations of taking the wafer W out of the FOUP 100 to perform the cleaning processing by the cleaning apparatus 2, subsequently performing the processing of drying the wafer W by the super critical processing apparatus 3, and then, carrying the wafer W into the FOUP 100. This program is stored in a storage medium 4b such as, for example, a hard disk, a compact disk, a magnet optical disk, or a memory card, and installed in the computer from the storage medium 4b.

Next, the configuration of the substrate processing container 31 of the supercritical processing apparatus 3 according to the present exemplary embodiment will be further described with reference to FIGS. 4 to 10.

As illustrated in FIGS. 4 to 10, the substrate processing container 31 includes the container body 31A having the opening 31a, the lid device 40 including the lid member 41 that seals the opening 31a, and the plate-shaped holding plate 42 that is connected to the lid member 41 and horizontally holds the wafer W.

In addition, a metal cooling plate (a cooling member) 45 is provided outside the container body 31A to cool the holding plate 42 by being vertically moved up and down with respect to the holding plate 42 to be in direct contact with the bottom surface of the holding plate 42.

The cooling plate 45 may be moved up by the lift mechanism 46 so as to be in direct contact with the bottom surface of the holding plate 42.

Figure 7:
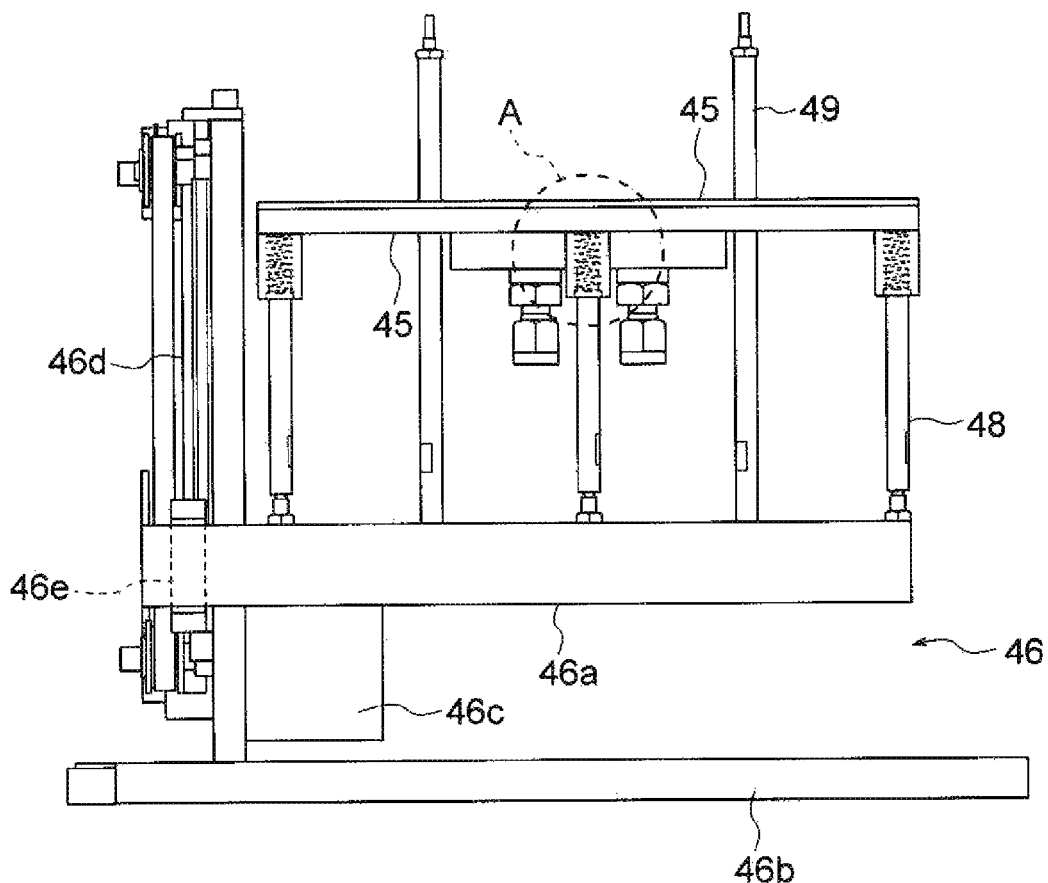
FIG. 7 is a view illustrating the cooling member and a lift mechanism.

Next, the lift mechanism 46 will be described. As illustrated in FIG. 7, the lift mechanism 46 includes a base 46b, a vertical guide 46d provided on the base 46b and extending vertically, and a lift table 46a moving up and down along the vertical guide 46d.

In addition, a driving motor 46c is attached to the lift table 46a, and a driving force from the driving motor 46c is delivered to a driving section 46e between the lift table 46a and the vertical guide 46d such that the lift table 46a is moved up along the vertical guide 46d.

On the lift table 46a of the lift mechanism 46 having the above-described configuration, a cooling member support pin 48 is provided to extend vertically, and the cooling plate 45 is supported by the cooling member support pin 48. In this case, a spring 50 is interposed between the cooling plate 45 and the cooling member support pin 48 so that, when the cooling plate 45 is moved up to be in direct contact with the bottom surface of the holding plate 42, the impact between the cooling plate 45 and the holding plate 42 may be relieved. Further, for example, even when the holding plate 42 is slightly inclined, the cooling plate 45 may be in contact with the inclined holding plate 42 thanks to the interposed spring 50 so that the holding plate 42 may be uniformly cooled (see FIG. 8).

Specifically, the spring 50 is attached to the top portion of the cooling member support pin 48, and a spring cover 50a is provided to cover the spring 50. In addition, a protrusion 50b formed on the spring cover 50a is fitted into an opening 45a of the cooling plate 45 such that the cooling member support pin 48 and the cooling plate 45 are connected to each other via the spring 50.

Figure 6:
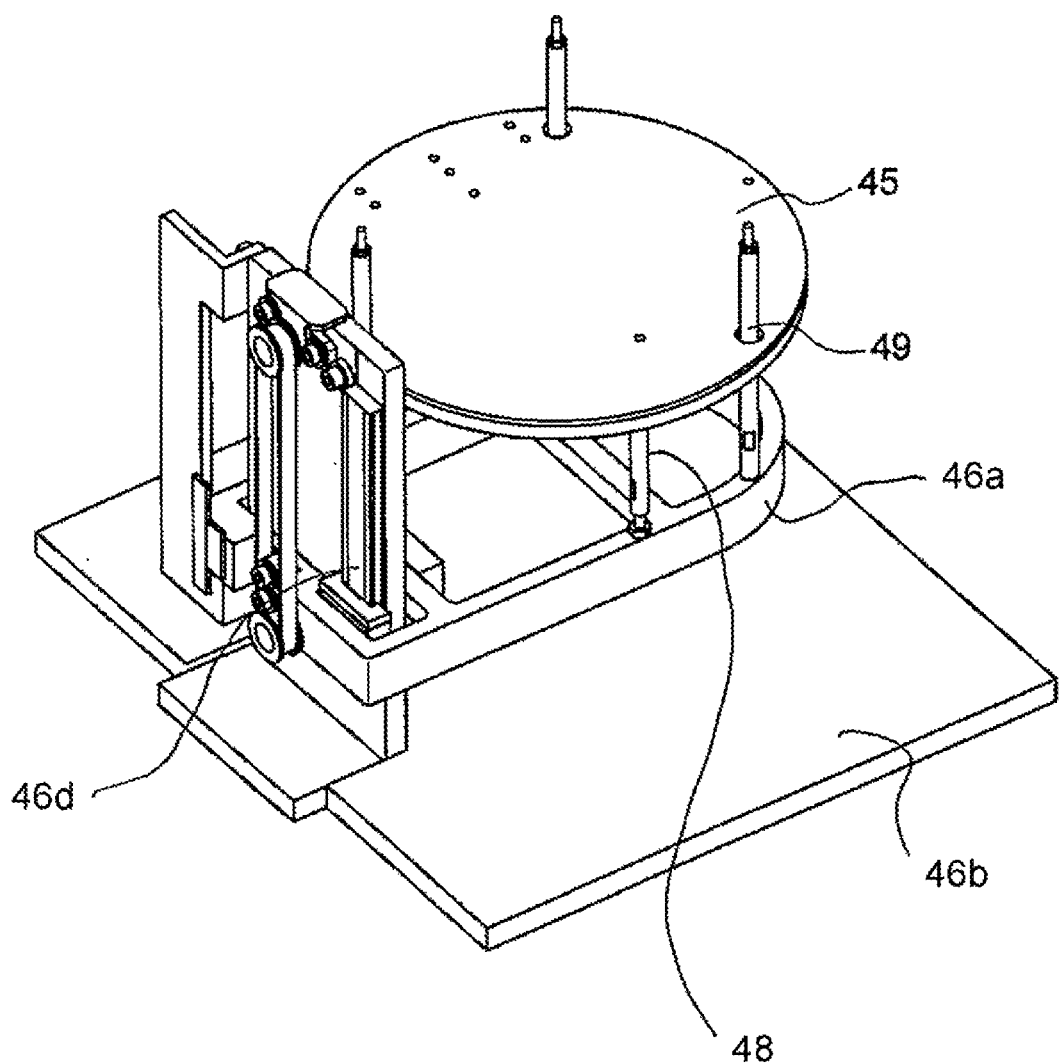
FIG. 6 is a perspective view illustrating an external appearance of a cooling member.
Figure 8:
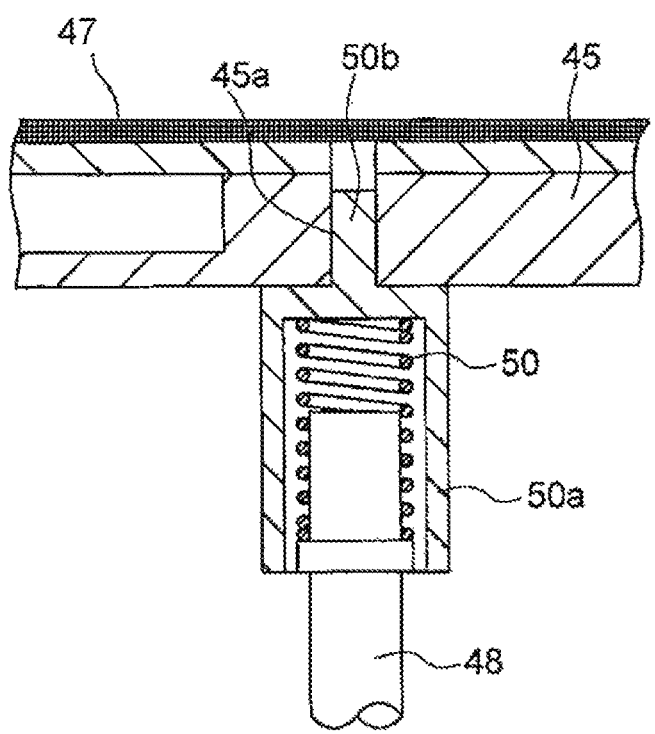
FIG. 8 is an enlarged view of the portion A in FIG. 7 which illustrates a connection relationship between the cooling member and a cooling member support pin.
Figure 9:
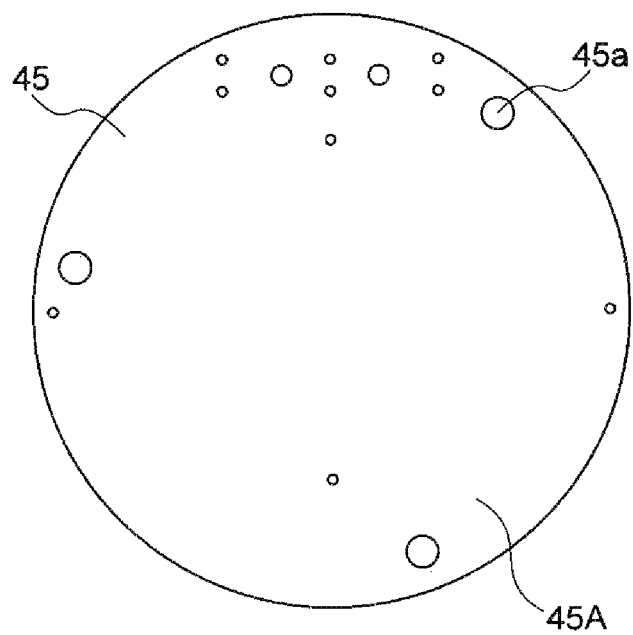
FIG. 9 is a plan view illustrating the cooling member.

As illustrated in FIGS. 6 to 8, in addition to the cooling member support pin 48, a substrate support pin 49 is provided on the lift table 46a of the lift mechanism 46 to support and move up and down the wafer W. The substrate support pin 49 supports and moves up and down the wafer W, and penetrates the openings 45a formed in the cooling plate 45 to extend vertically.

Figure 10:
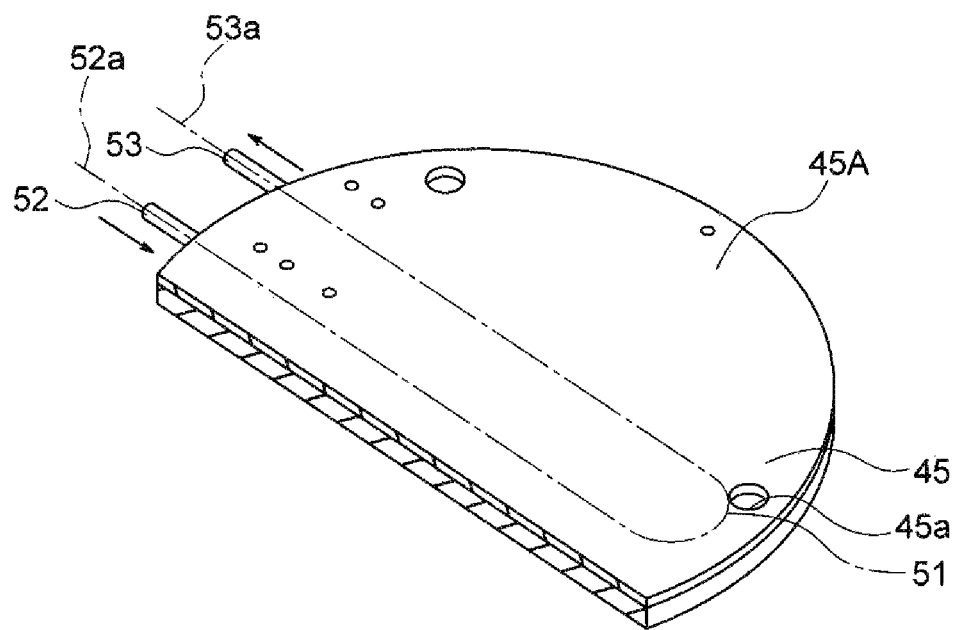
FIG. 10 is an exploded perspective view illustrating the cooling member.

As illustrated in FIG. 10, the cooling plate 45 includes a cooling plate body 45A and a cooling pipe 51 formed inside the cooling plate body 45A. A cooling water supply line 52a and a cooling water discharge line 53a are connected to one end 52 and the other end 53 of the cooling pipe 51, respectively. The cooling plate 45 having the above-described configuration is always cooled by a cooling medium flowing in the cooling pipe 51 of the cooling plate body 45A.

Next, an operation of the present exemplary embodiment having the above-described configuration will be described.

As described above, when the wafer W which has been subject to the cleaning processing in the cleaning apparatus 2 and on which the dry preventing IPA has been filled is delivered to the second conveyance mechanism 161, the second conveyance mechanism 161 enters the housing in which the supercritical processing apparatus 3 capable of receiving the wafer W is disposed.

At this time, before the carry-in of the wafer W, the supercritical processing apparatus 3 stands by in a state where a heater (not illustrated) of the substrate processing container 31 is turned ON so as to heat the inside of the substrate processing container 31, the inside of the substrate processing container 31 is opened to the atmosphere, and then, the opening/closing valve 35a of the fluid supply line 35 and the decompression valve 34a of the discharge line 34 are closed. In addition, the opening operation to the atmosphere is also performed in advance for the fluid supply line 35, and the opening/closing valve 35a and the flow rate adjusting valve 35c are closed in a state where no high-pressure $CO_2$ remains in the inside of the fluid supply line 35.

The wafer W on which the IPA has been filled is carried into the substrate processing container 31 standing by in the state described above. At this time, as illustrated in FIG. 4, the holding plate 42 of the lid device 40 is moved to the outside of the container body 31A. Then, the substrate support pin 49 is moved up by the lift mechanism 46 to project upward through an opening (not illustrated) of the holding plate 42. Then, the substrate support pin 49 receives the wafer W from the conveyance arm of the second conveyance mechanism 161. Next, the substrate support pin 49 is moved down by the lift mechanism 46 to place the wafer W on the holding plate 42 (see FIG. 5A). Then, the holding plate 42 of the lid device 40 is moved to carry the wafer W into the container body 31A through the opening 31a, and the opening 31a is closed by the lid member 41 such that the inside of the substrate processing container 31 is sealed (see FIG. 5B).

Figure 5A:
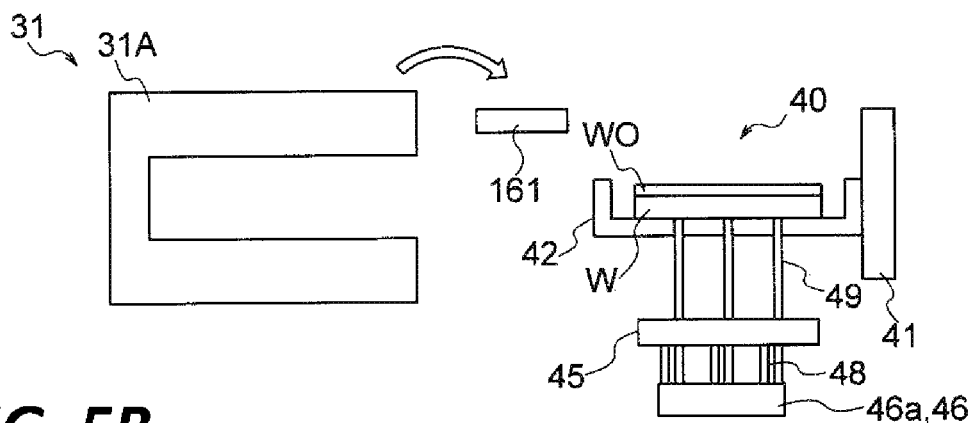
FIG. 5A is a view illustrating an operation of an exemplary embodiment of the present disclosure.
Figure 5B:
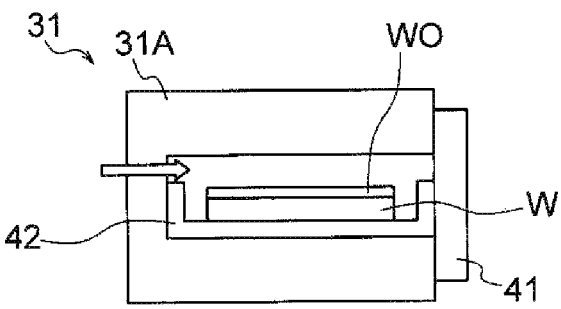
FIG. 5B is a view illustrating an operation of an exemplary embodiment of the present disclosure.
Figure 5C:
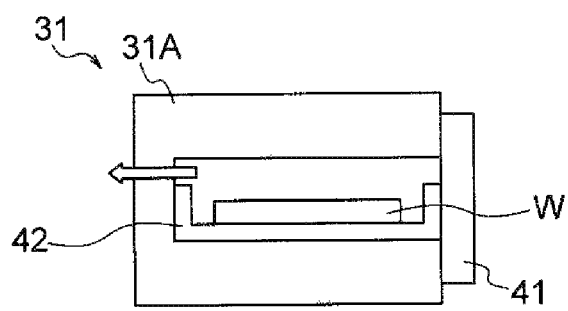
FIG. 5C is a view illustrating an operation of an exemplary embodiment of the present disclosure.

Subsequently, as illustrated in FIGS. 3 and 5B, the opening/closing valve 35a of the fluid supply line 35 is opened, and the opening degree of the flow rate adjusting valve 35c is regulated such that supercritical $CO_2$ is supplied into the substrate processing container 31 at a predetermined flow rate (see FIG. 5C).

When a target pressure is set for the inside of the substrate processing container 31, and the pressure inside the substrate processing container 31 exceeds the target pressure, the pressure controller 34b performs a control of the pressure inside the substrate processing container 31 by opening the decompression valve 34a to discharge a part of the supercritical $CO_2$ from the discharge line 34. At this time, the IPA filled on the surface of the wafer W is brought into contact with the supercritical $CO_2$ and extracted with the supercritical $CO_2$ so that the IPA is removed from the surface of the wafer W.

Then, the supercritical $CO_2$ finally enters a pattern formed on the front surface of the wafer W to extract and remove the IPA within the pattern. As a result, the IPA filled in the pattern is replaced with the supercritical $CO_2$ and removed from the front surface of the wafer W.

At this time, a part of the supercritical $CO_2$ that has extracted the IPA in the substrate processing container 31 is extracted from the discharge line 34, and a supply of new supercritical $CO_2$ from the fluid supply line 35 is continued. As a result, the processing of removing the IPA may be performed without largely deteriorating the performance of extracting the IPA by the supercritical $CO_2$ in the substrate processing container 31.

In this way, when a sufficient time lapses for extracting the IPA entering the pattern and replacing the IPA with the supercritical $CO_2$, the decompression valve 34a of the discharge line 34 is closed to release the pressure control performed by the pressure controller 34b, and the supply of the supercritical $CO_2$ from the fluid supply source 37 is stopped by closing the flow rate adjusting valve 35c. At this time, the inside of the substrate processing container 31 and the inside of the piping of the fluid supply line 35 are in a state of being filled with the supercritical $CO_2$.

When the supply of the supercritical $CO_2$ is stopped, the supercritical $CO_2$ inside the substrate processing container 31 and the piping of the fluid supply line 35 is discharged by opening the decompression valve 34a such that both the inside of the substrate processing container 31 and the inside of the piping of the fluid supply line 35 are decompressed to the atmospheric pressure. In this operation, the supercritical $CO_2$ remaining in the substrate processing container 31 and the fluid supply line 35 is changed as follows: "supercritical $CO_2$→high pressure $CO_2$ gas→low pressure $CO_2$ gas," with the decrease of the pressure, and the capability of keeping moisture or oil decreases.

In this way, the liquid IPA is removed from the inside of the pattern, in the substrate processing container 31 decompressed to the atmospheric pressure, and the wafer W in the dried state may be obtained.

Figure 5D:
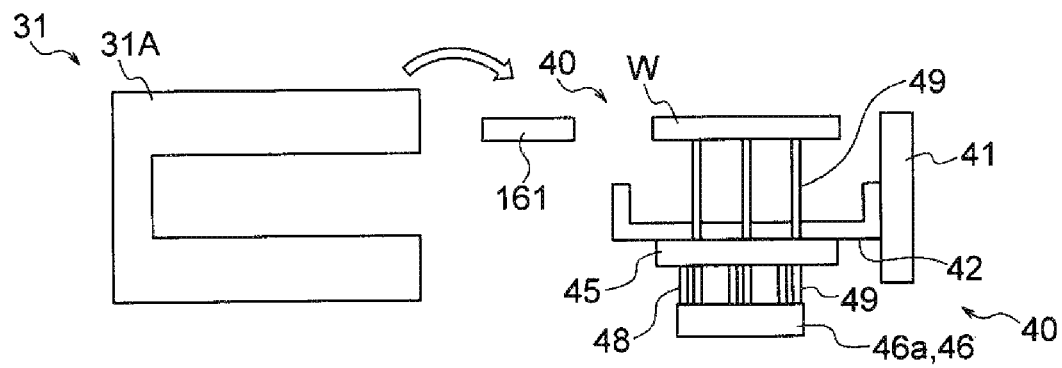
FIG. 5D is a view illustrating an operation of an exemplary embodiment of the present disclosure.

When the inside of the substrate processing container 31 is opened to the atmosphere so that the wafer W in the dried state is obtained, the holding plate 42 of the lid device 40 is moved to carry the wafer W out of the container body 31A of the substrate processing container 31 by the second conveyance mechanism 161, as illustrated in FIG. 5D.

In this case, the holding plate 42 of the lid device 40 reaches a position directly above the lift mechanism 46 provided outside the container body 31A. Next, the lift table 46a of the lift mechanism 46 is moved up by the driving motor 46c. At this time, as the lift table 46a is moved up, the cooling member support pin 48 and the substrate support pin 49 are also moved up.

In this case, as illustrated in FIGS. 7 and 8, the cooling member support pin 48 supports the cooling plate 45 via the spring 50, and the substrate support pin 49 penetrates the opening 45a of the cooling plate 45 to extend upward.

When the lift table 46a is further moved up, the substrate support pin 49 penetrates the opening (not illustrated) of the holding plate 42 to project upward and move up the wafer W. Next, the cooling plate 45 supported by the cooling member support pin 48 is brought into direct contact with the bottom surface of the holding plate 42 so as to cool the bottom surface of the holding plate 42.

When the supercritical processing is performed on the wafer W inside the substrate processing container 31, the holding plate 42 of the lid device 40 is heated to a high temperature inside the substrate processing container 31. In this state, when a new wafer W is placed on the holding plate 42 as described later, the dry preventing IPA filled on the wafer W may be dried by the heat from the holding plate 42.

According to the present exemplary embodiment, since the holding plate 42 is cooled by bringing the cooling plate 45 into direct contact with the bottom surface of the holding plate 42, the IPA on the wafer W may be prevented in advance from being dried by the heat of the holding plate 42.

Next, the wafer W moved up by the substrate support pin 49 is delivered to the conveyance arm of the second conveyance mechanism 161.

Next, as described above, a new wafer W on which the IPA has been filled is carried into the supercritical processing apparatus 3 and delivered to the substrate support pin 49 moved up through the opening of the holding plate 42.

Thereafter, the lift table 46a of the lift mechanism 46 is moved down such that the wafer W on the substrate support pin 49 is placed on the holding plate 42, and the cooling plate 45 supported by the cooling member support pin 48 is separated from the holding plate 42.

Thereafter, the holding plate 42 of the lid device 40 is moved to carry the wafer W on the holding plate 42 into the container body 31A, and the above-described supercritical processing is repeated on the wafer W.

Then, the wafer W is delivered to the first conveyance mechanism 121 via the buffer 131 and stored in the FOUP 100 through the route reverse to that for the carry-in of the wafer W. Then, a series of operations for the wafer W are completed.

As described above, according to the present exemplary embodiment, the holding plate 42 heated to a high temperature by performing the supercritical processing on the wafer W inside the substrate processing container 31 may be cooled by bringing the cooling plate 45 into direct contact with the holding plate 42. Thus, when a new wafer W on which the IPA has been filled is placed on the holding plate 42, the IPA filled on the new wafer W is not dried by the heat of the holding plate 42, and an appropriate supercritical processing may be performed on the wafer W. In addition, since the cooling plate 45 is supported by the cooling member support pin 48 via the spring 50, large impact is not applied to the holding plate 42 from the cooling plate 45 even when the lift table 46a of the lift mechanism 46 is moved up so as to bring the cooling plate 45 into contact with the bottom surface of the holding plate 42. In addition, for example, even when the holding plate 42 is slightly inclined, the cooling plate 45 may be in contact with the holding plate 42 thanks to the interposed spring 50 so that the holding plate 42 may be uniformly cooled.

In addition, by using the single lift mechanism 46, the cooling plate 45 may be brought into contact with the bottom surface of the holding plate 42 by the cooling member support pin 48, and the wafer W may be moved up by the substrate support pin 49.

Meanwhile, in the above-described exemplary embodiment, the example where the metal cooling plate 45 is used as the cooling plate 45 has been described. However, the present disclosure is not limited thereto, and an elastic or buffer material 47 may be provided on the top portion of the cooling plate 45 so that the impact between the cooling plate 45 and the holding plate 42 may be relieved.

In addition, the example where the plate-shaped holding plate 42 is used as a holding member has been described.

However, a ring-shaped holding member that holds only the peripheral edge of the wafer W may be used.

In the above exemplary embodiment, the holding plate 42 is cooled by causing the holding plate 42 and the cooling plate 45 to be in direct contact with each other. However, the present disclosure is not limited thereto. For example, the holding plate 42 and the cooling plate 45 may be located close to each other so as to form a minute gap to the extent that the holding plate 42 and the cooling plate 45 are not in contact with each other. When the cooling plate 45 is not heated to a high temperature, the holding plate 42 may be cooled without causing the holding plate 42 and the cooling plate 45 to be in direct contact with each other.

Figure 11:
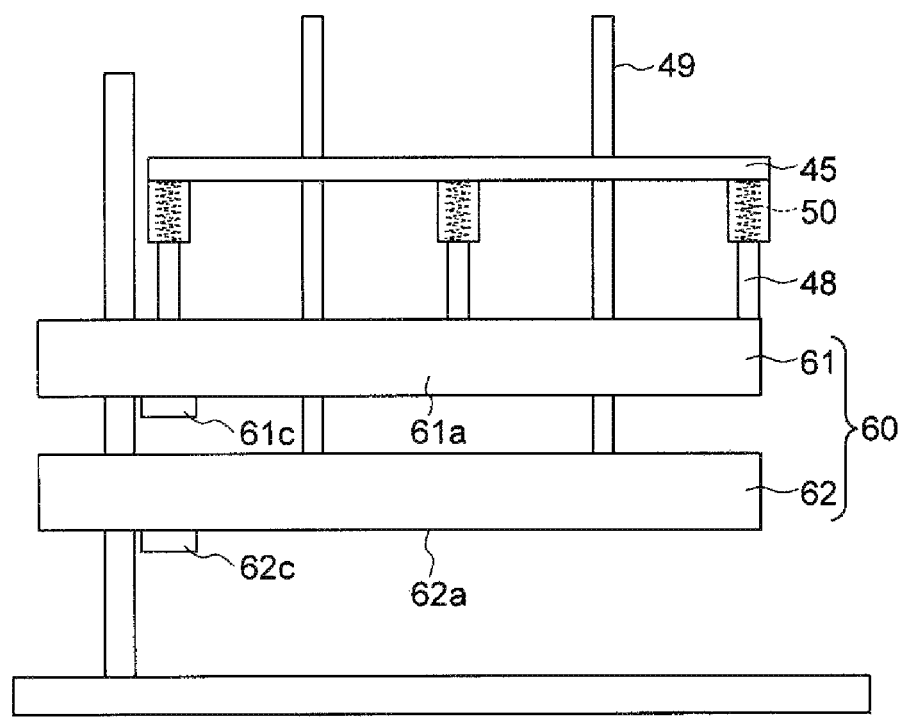
FIG. 11 is a side view illustrating a modification of the cooling member and the lift mechanism.

In addition, in the above-described exemplary embodiment, the lift mechanism 46 is configured such that the cooling plate 45 and the substrate support pin 49 are integrally provided and moved up and down together. However, the present disclosure is not limited thereto. The lift mechanism 60 may include a first lift mechanism 61 that vertically moves up and down the cooling plate 45 and a second lift mechanism 62 that vertically moves up and down the substrate support pin 49 such that the first lift mechanism 61 and the second lift mechanism 62 independently perform the up-and-down movement. For example, as illustrated in FIG. 11, the holding plate 42 of the lid device 40 is moved to carry the wafer W out of the container body 31A of the substrate processing container 31. In this case, the holding plate 42 of the lid device 40 reaches a position directly above the lift mechanism 60 provided outside the container body 31A. Next, the lift table 61a of the lift mechanism 61 is moved up by the driving motor 61c so as to cause the cooling plate 45 to be close to or in direct contact with the holding plate 42. Next, the lift table 62a of the second lift mechanism 62 is moved up by the driving motor 61c so as to move up the substrate support pin 49. As a result, in addition to the holding plate 42, the wafer W may also be cooled until the time immediately before the wafer W is received by the conveyance arm of the second conveyance mechanism 161.

In the above exemplary embodiment, the supercritical processing apparatus performing the supercritical processing on the wafer W by using the supercritical fluid has been described. However, the present disclosure is not limited thereto. The present disclosure may also be applied to an apparatus performing a processing by heating a liquid filled on the wafer W without using the supercritical fluid.

In addition, in the present exemplary embodiment, the example in which the spring 50 is provided between the cooling plate 45 and the cooling member support pin 48 has been described. However, the spring 50 may be a metal spring or a fluid spring of gas or liquid.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising:
a container body in which a processing is performed on a substrate;
a substrate holder that conveys the substrate from an outside of the container body into the container body and holds the substrate inside the container body during the processing;
a first lift table positioned outside the container body having a plurality of cooling member support pins extending therefrom and supporting a cooling member including a cooling plate configured to cool the substrate holder and the substrate;
a second lift table positioned outside the container body that supports a plurality of substrate support pins extending upwardly from the second lift table, the plurality of substrate support pins configured to directly support the substrate;
a base that supports the first lift table and the second lift table; and
a stationary vertical guide having a first end fixed to the base and a second end opposite the first end that extends vertically from the base,
wherein the first lift table is configured to move the plurality of cooling member support pins up and down relative to the plurality of substrate support pins and the second lift table, the second lift table is configured to move the plurality of substrate support pins up and down relative to the plurality of cooling member support pins and the first lift table, and both the first lift table and the second lift table are configured to move up and down along the stationary vertical guide, and
wherein the second end of the stationary vertical guide is positioned vertically above the first lift table and the second lift table.

2. The substrate processing apparatus of claim 1, wherein the cooling member is configured to be moved up by the first lift table to contact the substrate holder and thereby cool the substrate holder by being in direct contact with the substrate holder.

3. The substrate processing apparatus of claim 2, wherein the cooling member includes a buffer material positioned on a top surface of the cooling plate, the buffer material having an elasticity such that an impact between the cooling member and the substrate holder, when the cooling member is moved upward by the first lift table to directly contact the substrate holder, is relieved.

4. The substrate processing apparatus of claim 1, wherein each cooling member support pin supports the cooling plate via a spring.

5. The substrate processing apparatus of claim 1, wherein the cooling plate includes a plurality of openings through which the substrate support pins extend thereby penetrating the cooling plate to support the substrate.

6. The substrate processing apparatus of claim 1, wherein the container body is a substrate processing container for a supercritical processing.

7. The substrate processing apparatus of claim 1, wherein the first lift table has a first opening therein, the second lift table has a second opening therein, and the stationary vertical guide extends through the first opening in the first lift table and the second opening in the second lift table.

8. A substrate processing method comprising:
providing a substrate processing apparatus that includes:
a container body in which a processing is performed on a substrate; a substrate holder that conveys the substrate from an outside of the container body into the container body and holds the substrate inside the container body during the processing; a first lift table positioned outside the container body and having a plurality of cooling member support pins extending therefrom and supporting a cooling member including a cooling plate configured to cool the substrate holder and the substrate; and a second lift table positioned outside the container body supporting a plurality of substrate support pins that extend upwardly from the second lift table and configured to directly support the substrate;

conveying the substrate from the outside of the container body into the container body by the substrate holder;

performing a processing while holding the substrate inside the container body by the substrate holder;

cooling the substrate holder by discharging the substrate on the substrate holder outside the container body and operating the first lift table to move the plurality of cooling member support pins upward relative to the plurality of substrate support pins, and simultaneously causing the cooling member including the cooling plate to approach the substrate holder; and placing a new substrate on the substrate holder, wherein the first lift table is configured to move the plurality of cooling member support pins up and down relative to the plurality of substrate support pins and the second lift table, the second lift table is configured to move the plurality of substrate support pins up and down relative to the plurality of cooling member support pins and the first lift table, and both the first lift table and the second lift table are supported by a base and are each configured to move up and down along a stationary vertical guide having a first end fixed to the base and a second end opposite the first end extending vertically therefrom, and wherein the second end of the stationary vertical guide is positioned vertically above the first lift table and the second lift table.

9. A non-transitory computer-readable storage medium storing a computer executable program that, when executed, causes a computer to control a substrate processing method including:

providing a substrate processing apparatus that includes: a container body in which a processing is performed on a substrate; a substrate holder that conveys the substrate from an outside of the container body into the container body and holds the substrate inside the container body during the processing; a first lift table positioned outside the container body and having a plurality of cooling member support pins extending therefrom and supporting a cooling member including a cooling plate configured to cool the substrate holder and the substrate; and a second lift table positioned outside the container body supporting a plurality of substrate support pins that extend upwardly from the second lift table and configured to directly support the substrate;

conveying the substrate from the outside of the container body into the container body by the substrate holder;

performing a processing while holding the substrate inside the substrate processing container by the substrate holder;

cooling the substrate holder by discharging the substrate on the substrate holder outside the container body and operating the first lift table to move the plurality of cooling member support pins upward relative to the plurality of substrate support pins, and simultaneously causing the cooling member including the cooling plate to approach the substrate holder; and placing a new substrate on the substrate holder, wherein the first lift table is configured to move the plurality of cooling member support pins up and down relative to the plurality of substrate support pins and the second lift table, the second lift table is configured to move the plurality of substrate support pins up and down relative to the plurality of cooling member support pins and the first lift table, and both the first lift table and the second lift table are supported by a base and are each configured to move up and down along a stationary vertical guide having a first end fixed to the base and a second end opposite the first end extending vertically therefrom, and wherein the second end of the stationary vertical guide is positioned vertically above the first lift table and the second lift table.

* * * * *